United States Patent
Jiang

(10) Patent No.: US 9,157,951 B1
(45) Date of Patent: Oct. 13, 2015

(54) TESTING ELECTRONIC DISPLAYS FOR CONFORMITY TO A STANDARD

(75) Inventor: Simon Jiang, Allen, TX (US)

(73) Assignee: ARMSTEL HOLDING, LLC, Allen, TX (US)

( * ) Notice: Subject to any disclaimer, the term of this patent is extended or adjusted under 35 U.S.C. 154(b) by 846 days.

(21) Appl. No.: 13/195,312

(22) Filed: Aug. 1, 2011

(51) Int. Cl.
    *G01D 3/00*     (2006.01)
    *G01R 31/28*     (2006.01)

(52) U.S. Cl.
    CPC ........ *G01R 31/2834* (2013.01); *G01R 31/2894* (2013.01)

(58) Field of Classification Search
    None
    See application file for complete search history.

(56) References Cited

U.S. PATENT DOCUMENTS 8,519,956 B2 * 8/2013 Rust et al. .............. 345/158
2009/0054755 A1 * 2/2009 Shiibashi .............. 600/407

* cited by examiner

*Primary Examiner* — Aditya Bhat
(74) *Attorney, Agent, or Firm* — Haynes and Boone, LLP

(57) ABSTRACT

A system and method are provided for determining whether a vendor-neutral electronic display conforms to a standard. A vendor-neutral software product installed on a computer causes a portion of an electronic display to produce a first test output, the computer being coupled to the electronic display. A vendor-neutral portable device coupled to the computer captures a light characteristic of the first test output. A determination is made whether the captured light characteristic conforms to a standard.

A meter comprises a plurality of photodiodes; a custom processor coupled to the plurality of diodes; and a USB link coupled to the custom processor and able to couple to a computer. The computer couples to an electronic display and includes a vendor-neutral software product that is able to cause a portion of the electronic display to produce a first test output. The plurality of photodiodes is able to capture a light characteristic of the first test output. The custom processor is able to determine whether the captured light characteristic conforms to a standard.

20 Claims, 10 Drawing Sheets

TESTING ELECTRONIC DISPLAYS FOR CONFORMITY TO A STANDARD

TECHNICAL FIELD

The present invention relates generally to the field of human information display and, more particularly, to systems and methods for determining whether an electronic display displays pixel arrays to human users in conformity with a standard.

BACKGROUND

Modern human society includes a wide variety of environments in which humans must process large amounts of complex information, often under time-sensitive deadlines. Various mechanisms have been developed to collect, synthesize, and convey complex information to humans in a manner that facilitates communication and understanding. For example, color-coding and/or shading have long been an effective mechanism to convey information to improve understanding.

Additionally, certain technological advances have naturally developed shading techniques as an organic aspect of the technology. For example, x-ray images inherently include gradations of shade, which skilled technicians use to gather information relating to medical conditions, material composition, internal construction, and a wide variety of other purposes.

Advances in display technology have allowed for applications that can process x-ray images (and other analog images) as digital images. Such images are often processed as a monochromatic image. However, current display devices that can process these images with the appropriate clarity and precision are often cost-prohibitive. Similarly, common cost-effective display equipment cannot display the number of different monochrome shades necessary to support the proper resolution of the image.

Moreover, in applications requiring certain minimum resolution and other display capabilities, industry standards have arisen to help end-users determine whether a particular display meets the end-user's display requirements. For example, one such standard is the Digital Imaging and Communications in Medicine (DICOM) standard for handling, storing, printing, and transmitting information in medical imaging. The National Electrical Manufacturers Association (NEMA) created the DICOM standard in part to insure that diagnostic images appear the same, whether viewed via print, film, or electronic display.

But even with an industry standard to guide end-users in selecting appropriate display equipment, the industry standard only informs the end-user that a particular brand and/or model of display equipment is theoretically capable of displaying images that conform to the industry standard. Defects in manufacturing, problems in manufacturer's product testing, and wear-and-tear over time can all degrade performance to the extent that a particular display device no longer conforms to the desired industry standard.

Current systems and methods to determine whether a particular display device conforms to a given industry standard suffer from various drawbacks. For example, typical cost-effective measures are frequently insufficiently accurate to meet the needs of end-users seeking conformity to complex standards. Moreover, while measures do exist that meet the diagnostic needs of end-users seeking conformity to complex standards, such measures are typically cost-prohibitive and/or biased in favor of one or more manufacturers.

BRIEF SUMMARY

The following summary is provided to facilitate an understanding of some of the innovative features unique to the embodiments disclosed and is not intended to be a full description. A full appreciation of the various aspects of the embodiments can be gained by taking into consideration the entire specification, claims, drawings, and abstract as a whole.

In a general aspect of the invention, a method for determining whether an electronic display conforms to a standard comprises causing a portion of an electronic display to produce a first test output, the causing being performed by a vendor-neutral software product installed on a computer, the computer being coupled to the electronic display. The method also comprises capturing a light characteristic of the first test output with a vendor-neutral portable device, the vendor-neutral portable device being coupled to the computer. The method also comprises determining whether the captured light characteristic conforms to a standard.

In a preferred embodiment, the standard is the DICOM standard. In another preferred embodiment, the electronic display is any vendor-neutral LCD display. In another preferred embodiment, the method further comprises calibrating the electronic display in response to the captured light characteristic of the first test output.

In another preferred embodiment, the method further comprises calibrating the electronic display in response to the captured light characteristic of the first test output; causing at least a portion of the electronic display to produce a second test output; capturing a light characteristic of the second test output with the portable device; and determining whether the captured light characteristic of the second test output conforms to the standard.

In another preferred embodiment, the method further comprises generating a report based on the determining whether the captured light characteristic conforms to a standard. In another preferred embodiment, determining whether the captured light characteristic conforms to a standard comprises comparing the captured light characteristic to a corresponding characteristic of a Barton curve.

In another preferred embodiment, the vendor-neutral portable device is a lux meter, the lux meter comprising: a plurality of photodiodes; a custom processor coupled to the plurality of diodes; and a USB link coupled to the custom processor and the computer. In another preferred embodiment, causing at least a portion of the electronic display to produce a first test output is performed by a computer program operating in conjunction with a common operating system.

In another general aspect of the invention, a system for determining whether an electronic display conforms to a standard comprises a vendor-neutral software product installed on a computer, the computer being coupled to an electronic display, the vendor-neutral software product able to cause a portion of the electronic display to produce a first test output. The system also comprises a vendor-neutral portable device coupled to the computer, the vendor-neutral device able to capture a light characteristic of the first test output. The system also comprises a first module coupled to the computer, the module able to determine whether the captured light characteristic conforms to a standard.

In a preferred embodiment, the standard is the DICOM standard. In another preferred embodiment, the electronic display is any vendor-neutral LCD display. In another preferred embodiment, the system further comprises a second module coupled to the computer, the second module able to calibrate the electronic display in response to the captured light characteristic of the first test output.

In another preferred embodiment, wherein the vendor-neutral software product is further able to: calibrate the electronic display in response to the captured light characteristic of the first test output; cause at least a portion of the electronic display to produce a second test output; receive a captured light characteristic of the second test output; and determine whether the captured light characteristic of the second test output conforms to the standard.

In another preferred embodiment, the light characteristic is luminance. In another preferred embodiment, determining whether the captured light characteristic conforms to a standard comprises comparing the captured light characteristic to a corresponding characteristic of a Barton curve.

In another preferred embodiment, the vendor-neutral portable device is a lux meter, the lux meter comprising: a plurality of photodiodes; a custom processor coupled to the plurality of diodes; and a USB link coupled to the custom processor and the computer. In another preferred embodiment, causing at least a portion of the electronic display to produce a first test output is performed by a computer program operating in conjunction with a common operating system.

In still another general aspect of the invention, a meter comprises a plurality of photodiodes; a custom processor coupled to the plurality of diodes; and a USB link coupled to the custom processor, the USB link able to couple to a computer. The computer includes a vendor-neutral software product installed on the computer, the computer being coupled to an electronic display, the vendor-neutral software product able to cause a portion of the electronic display to produce a first test output. The plurality of photodiodes is able to capture a light characteristic of the first test output. And the custom processor is able to determine whether the captured light characteristic conforms to a standard.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope of the invention. In the following discussion, numerous specific details are set forth to provide a thorough understanding of the present invention. Those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, user interface or input/output techniques, and the like, have been omitted inasmuch as such details are not considered necessary to obtain a complete understanding of the present invention, and are considered to be within the understanding of persons of ordinary skill in the relevant art.

As will be appreciated by one skilled in the art, the present invention may be embodied as a system, method, or computer program product. Accordingly, the present invention may take the form of an entirely hardware embodiment, an entirely software embodiment (including firmware, resident software, micro-code, etc.) or an embodiment combining software and hardware aspects, all of which may generally be referred to herein as a "circuit," "module," or "system." Furthermore, the present invention may take the form of a computer program product embodied in any tangible medium of expression having computer usable program code embodied in the medium.

Figure 1:
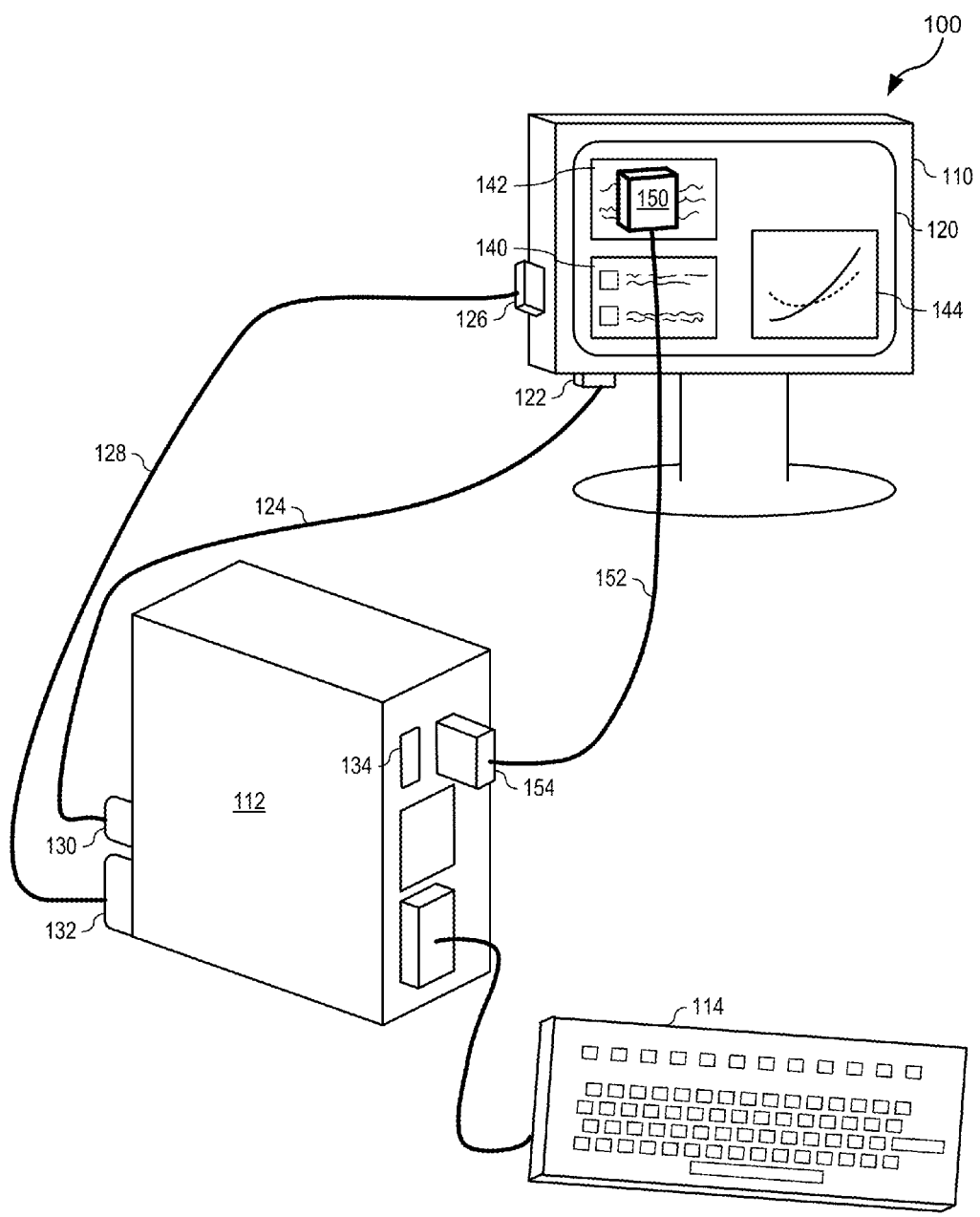
FIG. 1 is a block diagram showing a system for determining whether an electronic display conforms to a predetermined standard, in accordance with a preferred embodiment.

FIG. 1 is a high-level block diagram illustrating certain components of a system 100 for determining whether a target test display conforms to a standard. As described in more detail below, in one embodiment, system 100 can be configured to cause a target test display to generate test patterns and to determine whether the target test display conforms to a predetermined standard based on characteristics of emissions generated as target test display generates the test patterns.

Generally, the predetermined standard is any suitable standard and/or benchmark. In one embodiment, the standard is a generally-accepted or formal industry standard. In one embodiment, the predetermined standard is the Digital Imaging and Communications in Medicine (DICOM) standard for handling, storing, printing, and transmitting information in medical imaging. In one embodiment, the predetermined standard is the DICOM Part 14 Grayscale Standard Display Function standard. The National Electrical Manufacturers Association (NEMA) created the DICOM standard in part to insure that diagnostic images appear the same, whether viewed via print, film, or electronic display.

System 100 includes a display 110. In the illustrated embodiment, display 110 is the target test display. That is, in the illustrated embodiment, system 100 is configured to determine whether display 110 conforms to a predetermined standard. As used herein, the "target test display" is sometimes referred to as a "target display," "test display," "target electronic display." As used herein, the determination of whether a display conforms to a predetermined standard is sometimes referred to as a "test" or "inspection". Further, one or more components of a system that determines whether a display conforms to a predetermined standard are sometimes referred to herein as a "tester" or "inspector." Further, one or more components of a system that determines whether a display conforms to a predetermined standard are sometimes referred to herein by the trade name "Calispector™."

In the illustrated embodiment, display 110 is a computer monitor. In one embodiment, the test display is an enhanced grayscale display. As used herein, "grayscale", means any monochromatic range of shades. For ease of illustration, the disclosed embodiments are described with respect to a gray "grayscale," a range of shades based on a base color of gray. One skilled in the art will understand that the disclosed embodiments can be converted to operate with any base color so as to produce a range of shades in that base color. For example, in one embodiment, a display output is configured as a red grayscale. As such, unless otherwise indicated, "grayscale" and "monochromatic" are used herein substantially interchangeably.

One skilled in the art will understand that display 110 can be embodied in a variety of configurations. For example, typical modern digital displays now have essentially replaced analog CRT (Cathode-Ray Tube) displays. One skilled in the art will understand that while LCD (Liquid Crystal Display) monitors are the most common digital display technology on the market, other examples include PDP (Plasma Display Panel), LED (Light Emitting Diodes), OLED (Organic LEDs), DLP (Digital Light Processing), LCoS (Liquid Crystal on Silicon), SED (Surface-conduction electron-Emitter Display), FED, (Field Emission Display), MEMS (Micro-electro-mechanical systems), laser systems, and many others.

As shown, display 110 includes a display area 120. Generally, display area 120 is an array of pixels or other suitable display configured to produce images visible to the human eye. Generally, display area 120 generates images based on input received from a host or other system to which display 110 couples, as described in more detail below.

For example, in the illustrated embodiment, display 110 includes a data port 122. Generally, port 122 receives display information used to generate images for display in display area 120. In one embodiment, port 122 is a DVI-compatible port. In the illustrated embodiment, port 122 connects to a cable 124 that runs to a standalone workstation 112. For purposes of simplicity and so as not to distract from the embodiments disclosed herein, the terms "port" and a "connector" suitable to connect to that port are sometimes used interchangeably.

Generally, cable 124 is an otherwise conventional link between a display 110 and a computer or other suitable system. In one embodiment, cable 124 is a standard DVI cable. In the illustrated embodiment, cable 124 couples to a connector 130.

Generally, connector 130 connects to a standard port on workstation 112. In one embodiment, connector 130 is able to connect to a DVI port. In one embodiment, connector 130 is able to connect to a DVI port, a VGA port, an HDMI port, and/or other suitable port of workstation 112.

In the illustrated embodiment, display 110 also includes a data port 126. Generally, port 126 receives display information and instructions operable to display images in display area 120. In one embodiment, described in more detail below, port 126 also receives calibration information and/or instructions. Generally, as described in more detail below, in one embodiment, display 110 uses calibration information and instructions to modify setting related to the display of images in display area 120.

In one embodiment, only Armstel™ brand displays can be configured to receive and use calibration information and/or instructions, and therefore only Armstel brand displays can be calibrated to better conform to a standard, especially the DICOM standard.

In one embodiment, port 126 is a standard USB port. In the illustrated embodiment, port 126 connects to a cable 128 that couples to standalone workstation 112. Generally, cable 128 is an otherwise conventional link between a display 110 and a computer or other suitable system. In one embodiment, cable 128 is a standard USB cable. In the illustrated embodiment, cable 128 couples to a connector 132.

Generally, connector 132 connects to a standard port on workstation 112. In one embodiment, connector 132 is able to connect to a USB port. In one embodiment, connector 132 is able to connect to a serial port, parallel port, DVI port, and/or other suitable port of workstation 112.

Generally, workstation 112 is a computer and/or workstation able to execute program code, especially program code embodied on a non-transitory medium. In the illustrated embodiment, workstation 112 is a standalone workstation, such as a general-purpose personal computer, for example. In an alternate embodiment, workstation 112 is a special-purpose workstation, thin client, or standard computer running a common operations system (OS). In one embodiment, a common OS is Windows, Linux, Unix, etc. In the illustrated embodiment, workstation 112 transmits output to display 110, as described above, and receives input from a user interface 114.

Generally, user interface 114 is a device or plurality of devices to receive and/or transmit information from a user. In the illustrated embodiment, user interface 114 is a keyboard. In one embodiment, user interface 114 is one or more of a touch screen, softkey keyboard, a link to another system to capture user input, and/or other suitable device.

In the illustrated embodiment, workstation 112 also includes a plurality of ports 134. Generally, one or more of ports 134 are otherwise conventional USB ports.

As described in more detail below, in one embodiment, a system for testing a display includes hardware and/or software executing on or by workstation 112 (not shown). Generally, as described in more detail below, particularly with respect to FIG. 6, in one embodiment, a system for testing a display presents configuration options to a user, receives user input, generates test images for display on display 110, receives test result input from a test meter, compares received test results to a predetermined standard, and reports to the user the results of the comparison.

In the illustrated embodiment, a system for testing a display sends and receives information to/from connectors 130 and 132. In one embodiment, where display 110 is not able to receive calibration information and/or instructions, port 122, cable 124, and connector 130 can be disabled or omitted. As shown, a system for testing a display also sends and receives information to/from a connector 154.

Generally, connector 154 connects to a standard port on workstation 112. In one embodiment, connector 154 is able to connect to a USB port. In one embodiment, connector 154 is able to connect to a serial port, parallel port, DVI port, and/or other suitable port of workstation 112.

In the illustrated embodiment, connector 154 connects to a cable 152 that couples to a meter 150. Generally, cable 152 is an otherwise conventional link between a meter 150 and a computer or other suitable system, as described in more detail below. In one embodiment, cable 152 is a standard USB cable.

Figure 5:
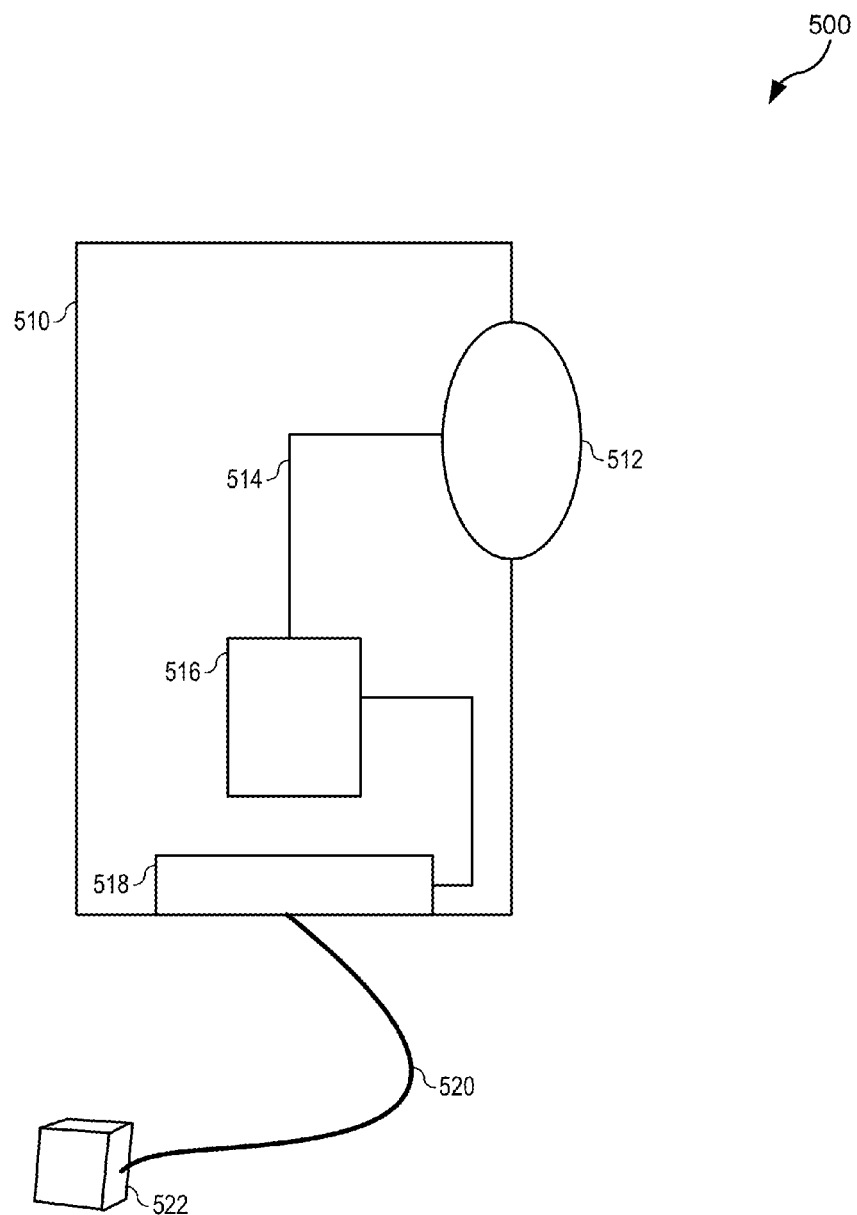
FIG. 5 is a high-level block diagram showing a device for determining whether an electronic display conforms to a predetermined standard, in accordance with a preferred embodiment.

Generally, in one embodiment, meter 150 couples to screen 120, receives emissions from display area 120, and sends signals to a system for testing a display on workstation 112 based on the emissions. FIG. 5 and the accompanying disclosure describe a meter 150 in one embodiment. In one embodiment, meter 150 is a lux meter. In one embodiment, a lux meter measures a luminosity characteristic of emissions received by the lux meter.

As described in more detail below, in one embodiment, a system for testing a display presents configuration options to a user and receives user input selecting one or more options. In the illustrated embodiment, a system for testing a display sends and receives configuration options and selections though a configuration graphical user interface (GUI) 140.

Generally, in one embodiment, a system for testing a display uses configuration selections received from a user to generate test patterns and other instructions. For example, in one embodiment, a system for testing a display sends test images to display 110, for display in display area 120.

In the illustrated embodiment, test patterns 142 are test patterns and/or images (or activated pixel patterns based on information stored in a graphics buffer, for example) generated by display 110. Generally, test patterns 142 generate emissions that can be analyzed to determine whether display 110 can generate displays in conformity with a standard. In one embodiment, test patterns 142 are presented in a standard window that can be manipulated by a mouse, as is common in typical operating systems.

As described in more detail below, in one embodiment, a user positions test patterns 142 so that the emissions generated by test patterns 142 can be captured by meter 150. Generally, a system for testing a display receives results from meter 150 and produces a report display 144. In the illustrated embodiment, report display 114 includes a graph. In one embodiment, report display 114 can include graphs, text, and/or other visual representations of information, in any combination.

Thus, in the illustrated embodiment, system 100 includes a system for testing a display wherein the system for testing the display and meter 150 operate from workstation 112. As one skilled in the art will understand, in some embodiments, workstation 112 and display 110 are typically operated together by a user, and workstation 112 ordinarily controls display 110. In an alternate embodiment, a system for testing a display and/or meter 150 can operate from a separate workstation or host system.

Figure 2:
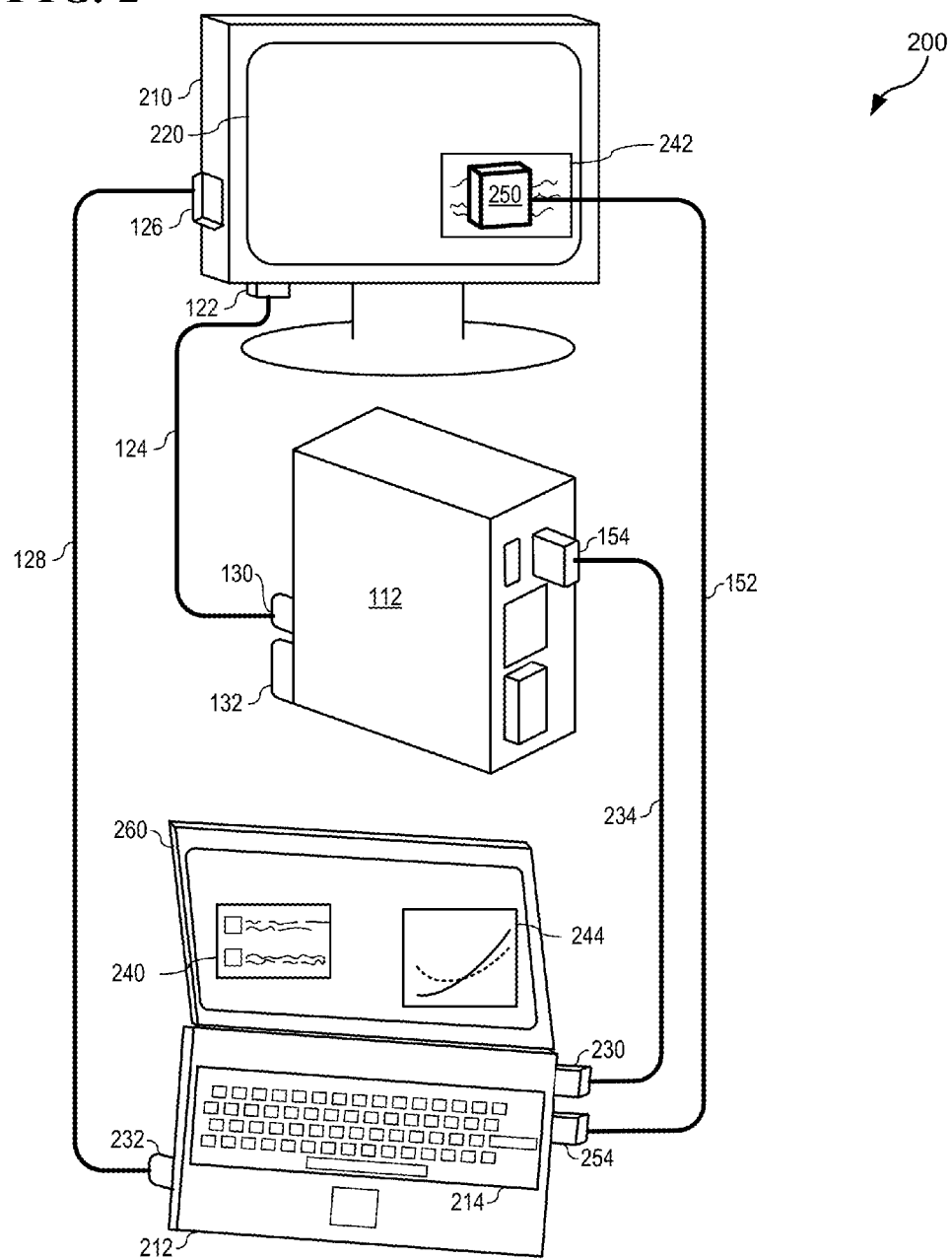
FIG. 2 is a block diagram showing a system for determining whether an electronic display conforms to a predetermined standard, in accordance with a preferred embodiment.

For example, FIG. 2 shows a system 200 for determining whether a test display conforms to a predetermined standard. System 200 includes a display 210. In the illustrated embodiment, display 210 is the target test display. That is, in the illustrated embodiment, system 200 is configured to determine whether display 210 conforms to a predetermined standard.

In the illustrated embodiment, display 210 is a computer monitor. In one embodiment, the test display is an enhanced grayscale display. One skilled in the art will understand that display 210 can be embodied in a variety of configurations. For example, typical modern digital displays now have essentially replaced analog CRT displays. One skilled in the art will understand that while LCD monitors are the most common digital display technology on the market, other examples include PDP, LED, OLED, DLP, LCoS, SED, FED, MEMS, laser systems, and many others.

As shown, display 210 includes a display area 220. Generally, display area 220 is an array of pixels other suitable display configured to produce images visible to the human eye. Generally, display area 220 generates images based on input received from a host or other system to which display 210 couples. In the illustrated embodiment, display 210 couples to workstation 112 in a similar manner as described above with respect to FIG. 1, with some modifications.

For example, in the illustrated embodiment, display 210 includes a data port 122. Generally, port 122 receives display information used to generate images for display in display area 220. In one embodiment, port 122 is a DVI-compatible port. In the illustrated embodiment, port 122 connects to a cable 124 that runs to a standalone workstation 112.

However, in the illustrated embodiment, display 210 also includes a data port 126. Generally, port 126 receives display information and instructions operable to display images in display area 220. In one embodiment, described in more detail below, port 126 also receives calibration information and/or instructions. Generally, as described in more detail below, in one embodiment, display 210 uses calibration information and instructions to modify setting related to the display of images in display area 220.

In one embodiment, port 126 is a standard USB port. In the illustrated embodiment, port 126 connects to a cable 128 that couples to a portable workstation 212. Generally, cable 128 is an otherwise conventional link between a display 110 and a computer or other suitable system. In one embodiment, cable 128 is a standard USB cable. In the illustrated embodiment, cable 128 couples to a connector 232.

Generally, connector 232 connects to a standard port on portable workstation 212. In one embodiment, connector 232 is able to connect to a USB port. In one embodiment, connector 232 is able to connect to a serial port, parallel port, DVI port, and/or other suitable port of portable workstation 212.

Generally, portable workstation 212 is a computer and/or workstation able to execute program code, especially program code embodied on a non-transitory medium. In the illustrated embodiment, portable workstation 212 is a laptop computer, such as a general-purpose personal computer, for example. In an alternate embodiment, portable workstation 212 is a portable special-purpose workstation, thin client, or standard computer running a common operations system (OS). In one embodiment, a common OS is Windows, Linux, Unix, etc. In the illustrated embodiment, workstation 212 receives input from display 210, as described above, and from a user interface 214.

Generally, user interface 214 is a device or plurality of devices to receive and/or transmit information from a user. In the illustrated embodiment, user interface 214 is a keyboard. In one embodiment, user interface 214 is one or more of a touch screen, softkey keyboard, a link to another system to capture user input, and/or other suitable device.

As described in more detail below, in one embodiment, a system for testing a display includes hardware and/or software executing on or by portable workstation 212 (not shown). Generally, as described in more detail below, particularly with respect to FIG. 6, in one embodiment, a system for testing a display presents configuration options to a user, receives user input, generates test images for display on display 210, receives test result input from a test meter, compares received test results to a predetermined standard, and reports to the user the results of the comparison.

In the illustrated embodiment, a system for testing a display sends and receives information to/from connectors 230 and 232. In one embodiment, where display 210 is not able to receive calibration information and/or instructions, port 126, cable 128, and connector 232 can be disabled or omitted. As shown, a system for testing a display also sends and receives information to/from a connector 254.

Generally, connector 254 connects to a standard port on workstation 212. In one embodiment, connector 254 is able to connect to a USB port. In one embodiment, connector 254 is able to connect to a serial port, parallel port, DVI port, and/or other suitable port of workstation 212.

In the illustrated embodiment, connector 254 connects to a cable 152 that couples to a meter 250. Generally, cable 152 is an otherwise conventional link between a meter 250 and a computer or other suitable system, as described in more detail below. In one embodiment, cable 152 is a standard USB cable.

Generally, in one embodiment, meter 250 couples to screen 220, receives emissions from display area 220, and sends signals to a system for testing a display on workstation 212 based on the emissions. FIG. 5 and the accompanying disclosure describe a meter 250 in one embodiment. In one embodiment, meter 250 is a lux meter.

As described in more detail below, in one embodiment, a system for testing a display presents configuration options to a user and receives user input selecting one or more options. In the illustrated embodiment, a system for testing a display sends and receives configuration options and selections though a configuration GUI 240.

Generally, in one embodiment, a system for testing a display uses configuration selections received from a user to generate test patterns and other instructions. For example, in one embodiment, a system for testing a display sends test images to display 210, for display in display area 220.

In the illustrated embodiment, a system for testing a display sends test images to display 210 through workstation 112. Specifically, in the illustrated embodiment, system 200 includes connector 230. Generally, connector 230 connects to a standard port on portable workstation 212. In one embodiment, connector 230 is able to connect to a serial port, parallel port, DVI port, and/or other suitable port of portable workstation 212.

In the illustrated embodiment, connector 230 couples to a cable 234. Generally, cable 234 is an otherwise conventional link between two network devices or other suitable devices. In one embodiment, cable 234 is a standard USB cable. In an alternate embodiment, cable 234 can be an Ethernet, internet, or other suitable link. In the illustrated embodiment, cable 234 connects to port 154 of workstation 112.

As described in more detail below, in one embodiment, a user positions test patterns 242 so that the emissions generated by test patterns 242 can be captured by meter 250. Generally, a system for testing a display receives results from meter 250 and produces a report display 244. In the illustrated embodiment, report display 244 includes a graph. In one embodiment, report display 244 can include graphs, text, and/or other visual representations of information, in any combination.

In the illustrated embodiment, system 200 displays configuration GUI 240 and report display 244 in display area 260, and displays test patterns 242 in display area 220. Thus, in the illustrated embodiment, system 200 includes a system for testing a display, wherein the system for testing the display and meter 250 operate from workstation 212. As one skilled in the art will understand, in some embodiments, workstation 112 and display 210 are typically operated together by a user, and workstation 112 ordinarily controls display 210. In the embodiment illustrated in FIG. 2, a system for testing a display and meter 250 both operate from portable workstation 212. Accordingly, one skilled in the art will appreciate that portable workstation 212 and meter 250 can be configured to inspect individual displays in remote locations without requiring extensive modifications to workstation 112.

Figure 3:
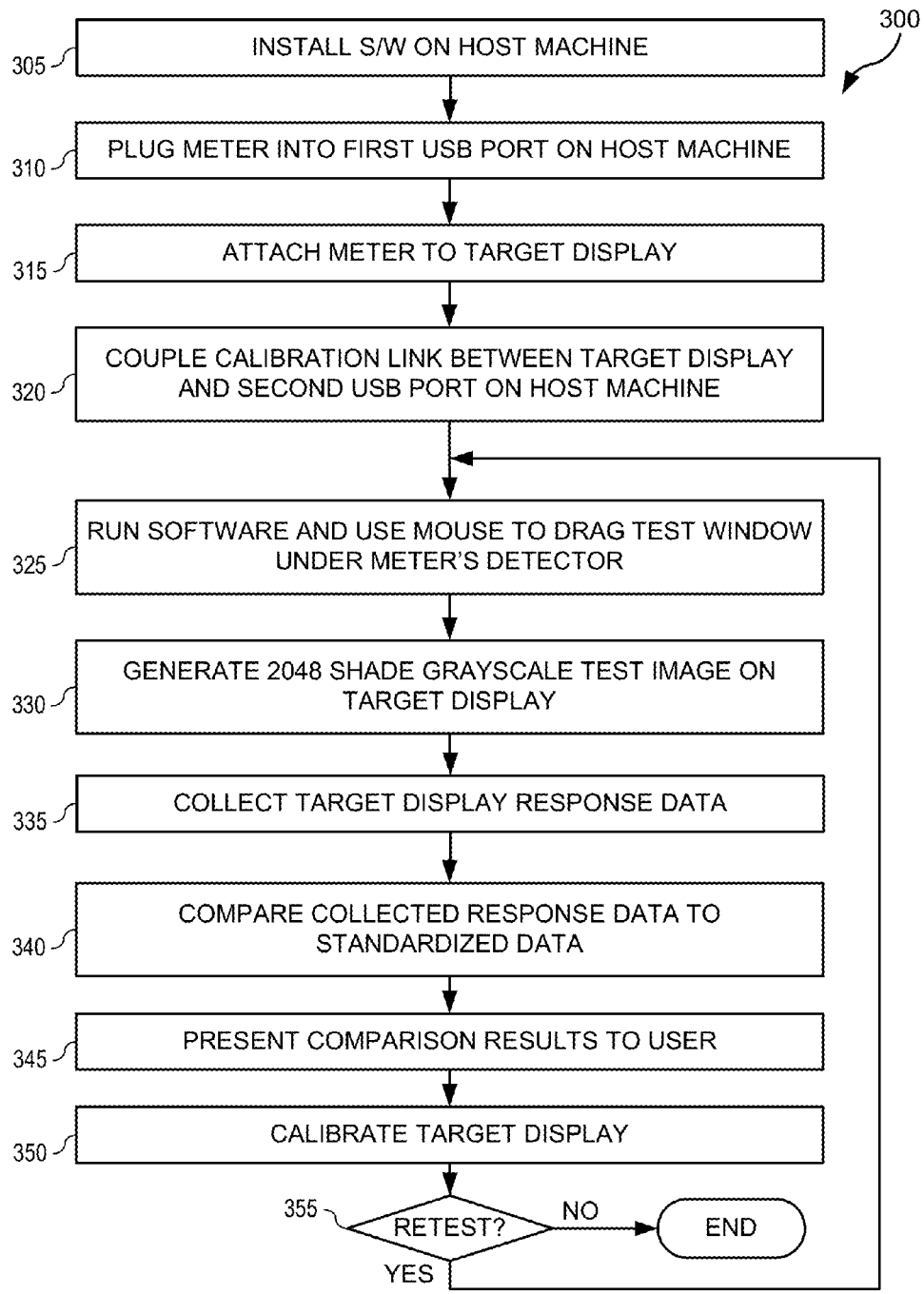
FIG. 3 is a high-level flow diagram depicting logical operational steps of a method for determining whether an electronic display conforms to a predetermined standard, which can be implemented in accordance with a preferred embodiment.

FIG. 3 illustrates one embodiment of a method for determining whether a target electronic display conforms to a predetermined standard. Specifically, FIG. 3 illustrates a high-level flow chart 300 that depicts logical operational steps performed by, for example, system 100 of FIG. 1, and/or system 200 of FIG. 2, which may be implemented in accordance with a preferred embodiment.

As indicated at block 305, the process begins, wherein software is installed on a host machine. In one embodiment, the host machine is a desktop computer. In another embodiment, the host machine is a laptop or other portable computer. Next, as indicated at block 310, a user plugs a meter into a first USB port on the host machine. For example, in one embodiment, a user plugs interface 154 into a USB port 134 on workstation 112.

Next, as indicated at block 315, a user attaches the meter to a target display. For example, in one embodiment, a user attaches meter 150 to display 110. Next, as indicated at block 320, a user couples a calibration link between the target display and a second USB port on the host machine. For example, in one embodiment, a user plugs connector 132 into a USB port on workstation 112.

Next, as indicated at block 325, a user runs the software installed on the host machine and drags a test window under the meter's detector. For example, in one embodiment, a user drags window 142 under the emission detectors of meter 150. Next, as indicated at block 330, the software generates a 2048-shade grayscale test image on the target display. For example, in one embodiment, the software generates the test image in window 142. In another embodiment, the system also collects configuration information from a user. For example, in one embodiment, the system collects configuration information from a user through GUI 140.

Next, as indicated at block 335, software sends requests to meter 150 to collect the target display response data. For example, in one embodiment, software 140 sends requests from interface 154, through cable 152 to meter 150 to collect emissions generated by display 120, and meter 150 collects emissions generated by display area 120 as display 110 displays the test image in window 142. Next, as indicated at block 340, the system compares the collected response data to standardized data. Generally, the standardized data is data that a target display that is configured in conformity with the standard would generate if subject to the same test patterns. In one embodiment, software and/or hardware operating on workstation 112 compares the collected response data to standardized data. In another embodiment, software and/or hardware operating on meter 150 compares the collected response data to standardized data.

Next, as indicated at block 345, the system presents comparison results to the user. For example, in one embodiment, the system presents to the user the results of the comparison in a window 144 of display area 120. In one embodiment, the system presents the results of the comparison based on user input received from the user.

Next, as indicated at block 350, the system calibrates the target display. As described in more detail below, in one embodiment, wherein the target display is a suitable display, the system sends calibration information and/or instructions to the target display through cable 128. That is, in one embodiment, the target display is configured to use received calibration information and/or instructions to calibrate display area to better conform to the standard. For example, in one embodiment, display 110 is an Armstel brand display that is configured to receive calibration information and/or instructions to calibrate display 110 to the DICOM standard.

Next, as indicated at decisional block 355, a determination is made whether to retest the target display. For example, in one embodiment, the system determines whether to retest the target display in response to user input. If at decisional block 355 the target display is not to be retested, the process continues along the NO branch and the process ends. If at decisional block 355 the target display is to be retested, the process continues along the YES branch, returning to block 325, as described above.

Figure 4:
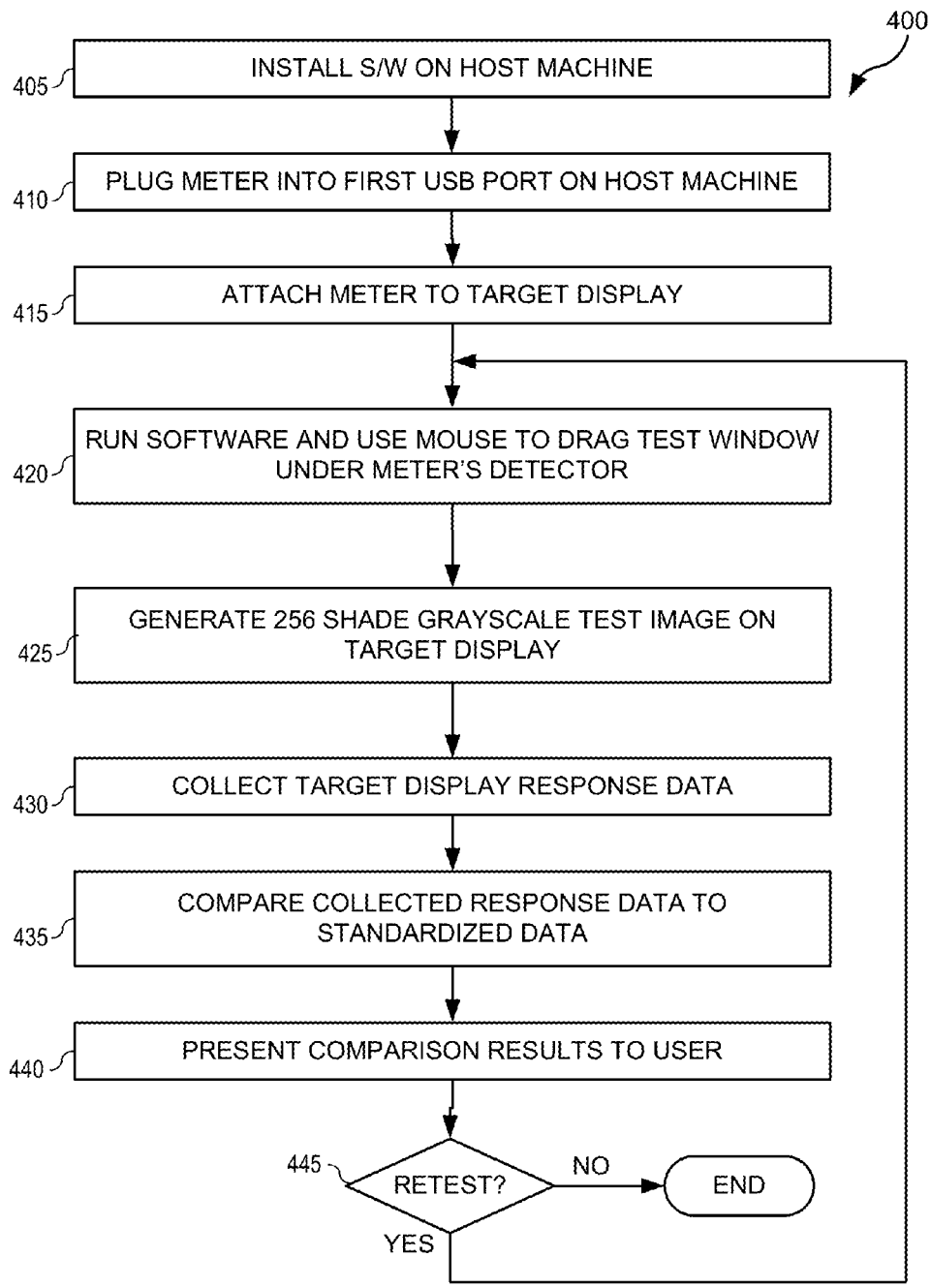
FIG. 4 is a high-level flow diagram depicting logical operational steps of another method for determining whether an electronic display conforms to a predetermined standard, which can be implemented in accordance with a preferred embodiment.

As described above, in one embodiment, only Armstel brand displays can be configured to receive and use calibration information and/or instructions. Accordingly, in one embodiment, the method described in FIG. 3 can only be applied to Armstel brand displays, as only Armstel brand displays can be calibrated to better conform to a standard, especially the DICOM standard. FIG. 4 illustrates an embodiment suitable for target displays that cannot be calibrated according to the embodiments disclosed herein.

Specifically, FIG. 4 illustrates one embodiment of a method for determining whether a target electronic display conforms to a predetermined standard. In the illustrated embodiment, FIG. 4 illustrates a high-level flow chart 400 that depicts logical operational steps performed by, for example, system 100 of FIG. 1, and/or system 200 of FIG. 2, which may be implemented in accordance with a preferred embodiment.

As indicated at block 405, the process begins, wherein software is installed on a host machine. In one embodiment, the host machine is a desktop computer. In another embodiment, the host machine is a laptop or other portable computer. Next, as indicated at block 410, a user plugs a meter into a first USB port on the host machine. For example, in one embodiment, a user plugs interface 154 into a USB port 134 on workstation 112.

Next, as indicated at block 415, a user attaches the meter to a target display. For example, in one embodiment, a user attaches meter 150 to display 110. Next, as indicated at block 420, a user runs the software installed on the host machine and drags a test window under the meter's detector. For example, in one embodiment, a user drags window 142 under the emission detectors of meter 150.

Next, as indicated at block 425, the software generates a 256-shade grayscale test image on the target display. For example, in one embodiment, the software generates the test image in window 142. In another embodiment, the system also collects configuration information from a user. For example, in one embodiment, the system collects configuration information from a user through GUI 140.

Next, as indicated in block 430, software sends requests to meter 150 to collect the target display response data. For example, in one embodiment, software 140 sends requests from interface 154, though cable 152, to meter 150 to collect emissions generated by display area 120 as display 110 displays the test image in window 142. Next, as indicated at block 435, the system compares the collected response data to standardized data. In one embodiment, software and/or hardware operating on workstation 112 compares the collected response data to standardized data. In another embodiment, software and/or hardware operating on meter 150 compares the collected response data to standardized data.

Next, as indicated at block 440, the system presents comparison results to the user. For example, in one embodiment, the system presents to the user the results of the comparison in a window 144 of display area 130. In one embodiment, the system presents the results of the comparison based on user input received from the user.

Next, as indicated at decisional block 445, a determination is made whether to retest the target display. For example, in one embodiment, the system determines whether to retest the target display in response to user input. If at decisional block 445 the target display is not to be retested, the process continues along the NO branch and the process ends. If at decisional block 445 the target display is to be retested, the process continues along the YES branch, returning to block 420, as described above.

As described above, in one embodiment, only Armstel brand displays can be configured to receive and use calibration information and/or instructions. Accordingly, in one embodiment, the method described in FIG. 3 can only be applied to Armstel brand displays, as only Armstel brand displays can be calibrated to better conform to a standard, especially the DICOM standard. FIG. 4 illustrates an embodiment suitable for target displays that cannot be calibrated according to the embodiments disclosed herein.

FIG. 5 illustrates a system 500 for measuring display characteristics of an electronic display. In a preferred embodiment, system 500 is configured to operate as part of system 100 and/or system 200, as described above with respect to FIGS. 1 and 2, respectively. In a preferred embodiment, system 500 is configured to perform one or more steps as described above in FIGS. 3 and 4. Specifically, in one embodiment, system 500 acts on the requests through link 520, and collects target display response data and transmits collected target display response data to a test platform.

In the illustrated embodiment, system 500 includes a casing 510. Generally, casing 510 forms an enclosure that encloses and protects the internal components of system 500. In one embodiment, casing 510 is manufactured out of durable, lightweight plastic. In one embodiment, casing 510 has a shape conforming to a particular ergonomic design. Generally, in a preferred embodiment, casing 510 has a shape, size, and weight that protect the internal components of system 500, make system 500 able to couple to a target display, make system 500 easy to manipulate by humans, and make system 500 attractive to humans.

As shown, system 500 also includes a test array 512 coupled to casing 510. In the illustrated embodiment, test array 512 is shown as partially extruding outward from the boundaries of the enclosure formed by casing 510. In an alternate embodiment, test array 512 rests entirely within the enclosure formed by casing 510. In such embodiments, casing 510 can include an aperture or other suitable feature (not shown) that allows emissions from the target test display to reach test array 512, such as a transparent window, for example.

Generally, test array 512 receives emissions from the target electronic display and generates a signal based on the received emissions. For example, in one embodiment, test array 512 is an array of photodiodes that capture light emissions from the target electronic display and that generates an electronic signal based on the luminosity of the captured light emissions. In another embodiment, test array 512 generates an optical signal. In another embodiment, test array 512 and system 500 are configured as follows:

Sensor: Silicon photodiode;
Optical Wavelength coverage: 350~600 nm;
Measuring range: 0~2000 Lux;
Accuracy: ±(3% Rdg+0.5 F.S)
   (while ambient temperature is 23±5° C.);
Resolution: 0.01 Lux;

Sampling rate: 0.3/s;
Repeatability: ±2%;
USB: USB2.0;
USB cable length: 1M.

One skilled in the art will appreciate that other suitable test arrays 512 can also be employed.

In the illustrated embodiment, test array 512 transmits a generated signal through link 514 to a custom processor 516. Generally, link 514 is a link suitable to transmit the signals from test array 512 in a form appropriate to custom processor 516. For example, in one embodiment, test array 512 generates electronic signals and link 514 is an electrical conduit. In an alternate embodiment, test array 512 generates optical signals and link 514 is an optical fiber or other suitable conduit.

In the illustrated embodiment, custom processor 516 receives electronic signals from link 514. In one embodiment, custom processor 516 is a customized computer processor chip. In one embodiment, custom processor includes contains custom software and or hardware operable to convert the received array signals into a format suitable for a host system to use. In one embodiment, custom processor 516 converts optical signals to electrical signals.

In one embodiment, custom processor 516 prepares received signals for processing and analysis by a host system. For example, in one embodiment, custom processor 516 performs the operations represented in block 335 of FIG. 3 and/or block 430 of FIG. 4.

Generally, in one embodiment, custom processor 516 generates response signals for transmission to a host system, the response signals representing the response of the target test display as the target test display generates test patterns. In one embodiment, custom processor 516 also receives requests from the host system, through link 520 from interface 518, to start emission data collection. In the illustrated embodiment, system 500 is configured to connect to a host system through a standard USB protocol.

For example, in the illustrated embodiment, system 500 includes interface 518. In the illustrated embodiment, interface 518 is a standard USB interface that couples to custom processor 516 and a link 520. In the illustrated embodiment, link 520 is a USB capable link that couples to a connector 522. In the illustrated embodiment, connector 522 is a standard USB connector, operable to couple to a standard USB port.

In one embodiment, interface 518 includes a USB chip. In one embodiment, interface 518 includes a consumer USB chip configured with custom software that implements one or more functions of the embodiments disclosed herein, especially preparation and transmission of collected test data to a host system. In one embodiment, interface 518 includes a general purpose microcontroller unit configured with a USB platform and a USB stack.

In one embodiment, interface 518 includes a processor. In one embodiment, interface 518 provides instructions and configuration information to custom processor 516, such as instructing custom processor 516 to perform data collection (through test array 512), for example.

In one embodiment, interface 518 receives test data from custom processor 516 and generates response signals for transmission to a host system, the response signals representing the response of the target test display as the target test display generates test patterns. In one embodiment, interface 518 generates the response signals in a proprietary operation configured to place the response data into a specific format. In one embodiment, the specific format is a USB-compatible format. In one embodiment, the specific format is a USB-compatible format configured to optimize transmission to a host system and analysis of the underlying display response data.

Figure 6:
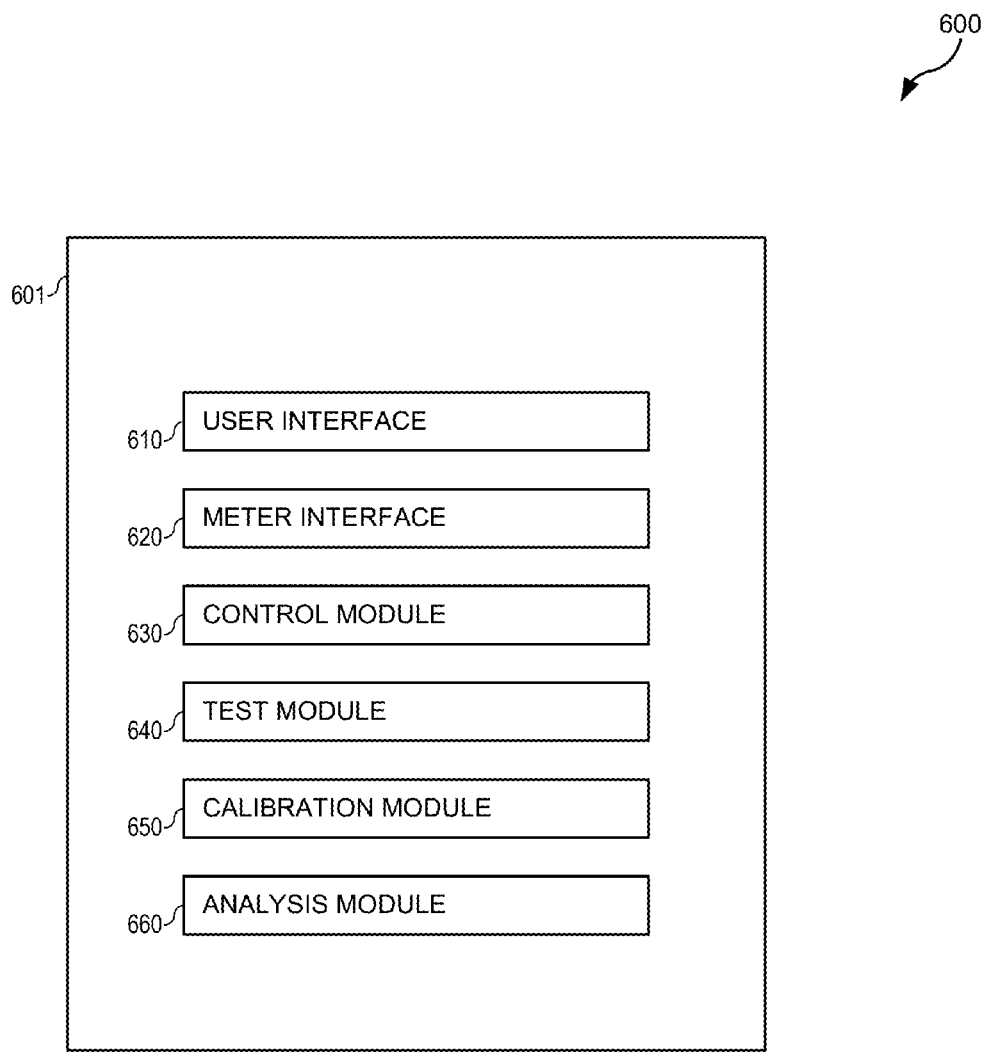
FIG. 6 is a block diagram showing a system for determining whether an electronic display conforms to a predetermined standard, in accordance with a preferred embodiment.

Thus, generally, in the illustrated embodiment, system 500 captures emissions from a target test display, as the target test display generates test patterns. System 500 generates target display response data to a host system for processing and/or reporting. FIG. 6 illustrates an exemplary host system in one embodiment.

Specifically, FIG. 6 illustrates a system 600 for measuring display characteristics of an electronic display. In a preferred embodiment, system 600 is configured to operate as part of system 100 and/or system 200, as described above with respect to FIGS. 1 and 2, respectively. In a preferred embodiment, system 600 is configured to perform one or more steps as described above in FIGS. 3 and 4. Specifically, in one embodiment, system 600 receives collected target display response data and determines whether the received collected target display response data indicates that the target electronic display conforms to a standard.

In the illustrated embodiment, system 600 is shown as a plurality of modules 610-660 that are grouped within a subsystem 601. Generally, in a preferred embodiment, subsystem 601 is a subsystem of a portable computer or desktop computer. In one embodiment, subsystem 601 is a software and/or hardware suite residing on a standard personal computer that is running a common operating system. For example, in one embodiment, a common operating system is Windows XP, Windows Vista, Windows 7, MacOS, Linux, Unix, or other suitable operating system.

In the illustrated embodiment, system 600 includes user interface 610. Generally, user interface 610 operates to present information to, and receive information from, a user. In one embodiment, the user is a human user. In an alternate embodiment, the user is a machine, configured to interact with system 600. In one embodiment, user interface 610 is a graphical user interface (GUI), suitable for display on a common electronic display.

Figure 7:
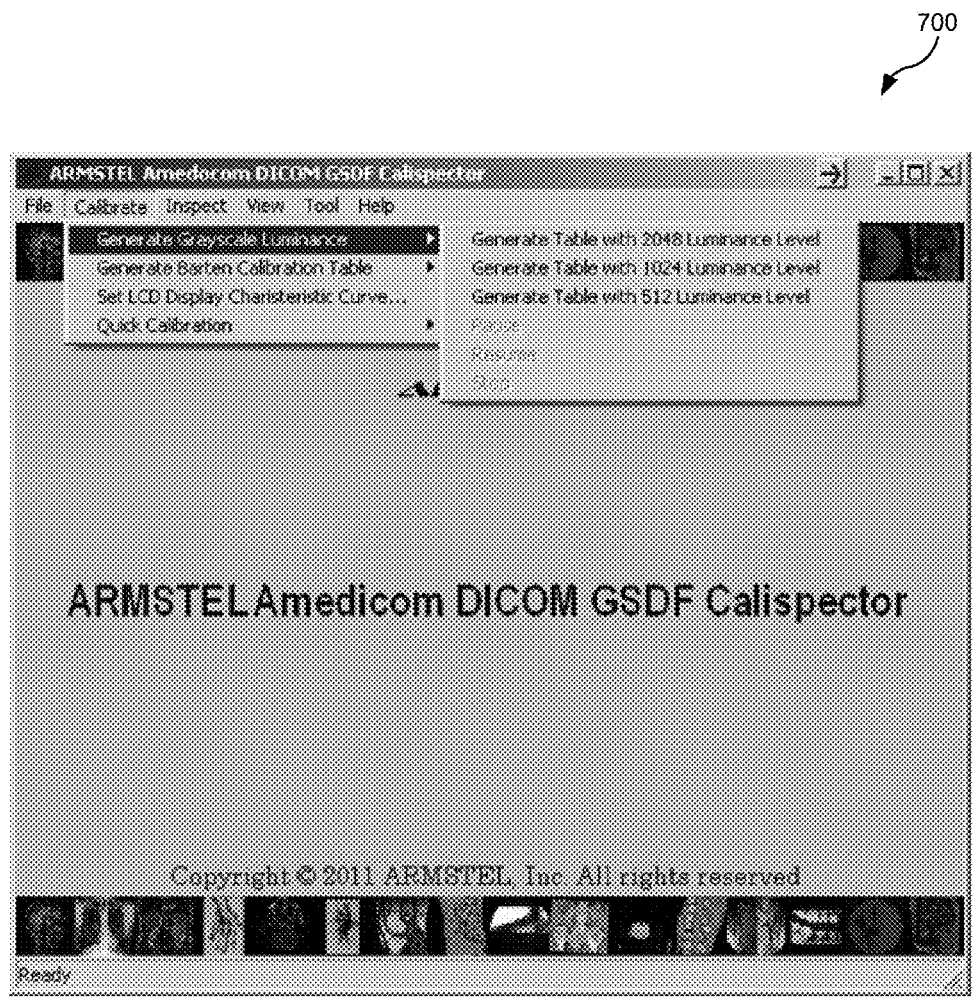
FIGS. 7 and 8 show a user interface in accordance with a preferred embodiment.
Figure 8:

In one embodiment, user interface 610 is configured to present configuration options to a user. In one embodiment, configuration options are variable settings that control one or more aspects of the test environment, test parameters, electronic display, look-and-feel options, and/or other suitable variables. For example, in one embodiment, configuration options include a user selection indicating whether the user wants to inspect an electronic display for conformity to a standard or to calibrate the electronic display to conform to the standard. FIGS. 7 and 8, described below, show an illustrative GUIs in two embodiments.

In the illustrated embodiment, system 600 also includes meter interface 620. Generally, meter interface 620 operates as an interface between one or more components of system 600 and a test device, such as system 500 or FIG. 5, for example. In one embodiment, meter interface 620 is a hardware interface capable of connecting to and communicating on a USB-standard bus. In one embodiment, meter interface 620 is capable of transmitting meter control information to a meter. In one embodiment, meter control information includes instructions and information that can be used by a meter to perform various meter operations. For example, in one embodiment, various meter options include self-test, self-calibration, display emission receipt, target display response data transmission configuration, test sensitivity, and other suitable operations, as described above with respect to FIG. 5.

In one embodiment, meter interface 620 operates in response to instructions provided by a control module. For example, in the illustrated embodiment, system 600 includes control module 630. Generally, control module 630 provides instructions and configuration information to one or more components of system 600. For example, in one embodiment, control module 630 receives user input from user interface 610 and transmits instructions to meter interface 620, to collect display emission luminance data, test module 640, calibration module 650, and analysis module 660, as described in more detail below.

In one embodiment, control module 630 operates in response to information received from a user. For example, in one embodiment, a user provides information selecting a test type, test duration, and industry standard. In another embodiment, a user provides information selecting between a 128-point inspection or a 256-point inspection. In one embodiment, control module 630 and meter interface module 620 receive instructions from a user, such as, for example, to display captured emission data.

In one embodiment, control module 630 provides instructions and configuration information to a test module. For example, in the illustrated embodiment, system 600 includes test module 640. Generally, test module 640 receives instructions and configuration information from control module 630 and generates one or more electronic display test patterns based on received instructions and configuration information. As described above, in one embodiment, test module 640 generates a draggable window within a user interface on the target test display, and displays one or more test images within the draggable window. In another embodiment, test module 640 transmits one or more test images to a window manager (or other operating system process), and the window manager generates a draggable window within a user interface on the target test display. In one embodiment, test module 640 generates and transmits requests to a test meter, instructing the test meter to begin collecting emission data from the display. For example, in one embodiment test module 640 transmits requests to interface 518 of meter 500, which provides instructions and configuration information to custom processor 516, such as instructing custom processor 516 to perform data collection (through test array 512), for example.

Generally, the one or more test images are configured to cause the target test display to generate images suitable for emission capture by a meter, as described above. In one embodiment, as described above, a meter captures emissions coming from the test display as the test display generates the one or more test images. In one embodiment, as described above, a meter transmits target display response data to system 600 for processing and analysis. In one embodiment, system 600 uses received target display response data to analyze the target display response data and to calibrate the target test display.

In the illustrated embodiment, system 600 includes analysis module 660. In one embodiment, control module 630 provides instructions and configuration information to analysis module 660. Generally, analysis module 660 receives instructions and configuration information from control module 630, receives target display response data, and analyzes received target display response data according to received instructions and configuration information. For example, as described above, in one embodiment, analysis module 660 compares received luminosity data to a standardized Barten curve to and determine whether the target test display conforms to the DICOM standard. As described above, in certain systems, system 600 can also calibrate the target test display based on results from analysis module 660.

For example, in the illustrated embodiment, system 600 includes calibration module 650. In one embodiment, control module 630 provides instructions and configuration information to calibration module 650. Generally, calibration module 650 receives instructions and configuration information from control module 630, receives analysis information from analysis module 660, and generates calibration instructions according to received instructions and configuration and analysis information. For example, as described above, in one embodiment, calibration module 650 receives instructions from the control module and sends calibration instructions to the target test display via a USB cable coupled to the target test display. As described above, in one embodiment, system 600 employs calibration instructions to bring a target test display into compliance with the predetermined standard.

One skilled in the art will understand that the target test display must be configured to receive calibration instructions in order for calibration to be effective. As such, in one embodiment, system 600 determines whether the target test display is configured to receive calibration instructions. In one embodiment, only certain target test displays are configured to receive calibration instructions. In one embodiment, the target test display is an Armstel brand monitor.

Thus, generally, the disclosed embodiments can be configured to inspect a target display to determine whether the target display conforms to a standard. As described above, in one embodiment, a system for testing whether a display conforms to a standard includes a GUI to receive user input. FIGS. 7 and 8 show exemplary GUIs configured to receive user input.

FIG. 7 is a screenshot showing a GUI 700 in one embodiment. In the illustrated embodiment, GUI 700 forms part of a standard windowed display of a common operating system. In the illustrated embodiment, GUI 700 includes menu items for file operations, calibration selections, inspection options, view options, tool options, and help. As shown, in one embodiment, the user can select from three different grayscale luminance calibration options. Specifically, in the illustrated embodiment, the user can select between generating a table of shades with 2048 luminance levels, 1024 luminance levels, or 512 luminance levels. Also shown are quick calibration options, options to generate a Barten calibration table, and options to set a liquid crystal display (LCD) characteristic curve.

Similarly, FIG. 8 is a screenshot showing a GUI 800 in one embodiment. In the illustrated embodiment, GUI 800 includes menu items for file operations, calibration selections, inspection options, view options, tool options, and help. As shown, in one embodiment, the user can instruct the system to begin inspection, pause, resume, or stop inspection. Additionally, the user can select from one or more options to save the results of the inspection. One skilled in the art will understand that other operations are also available.

Figure 9:
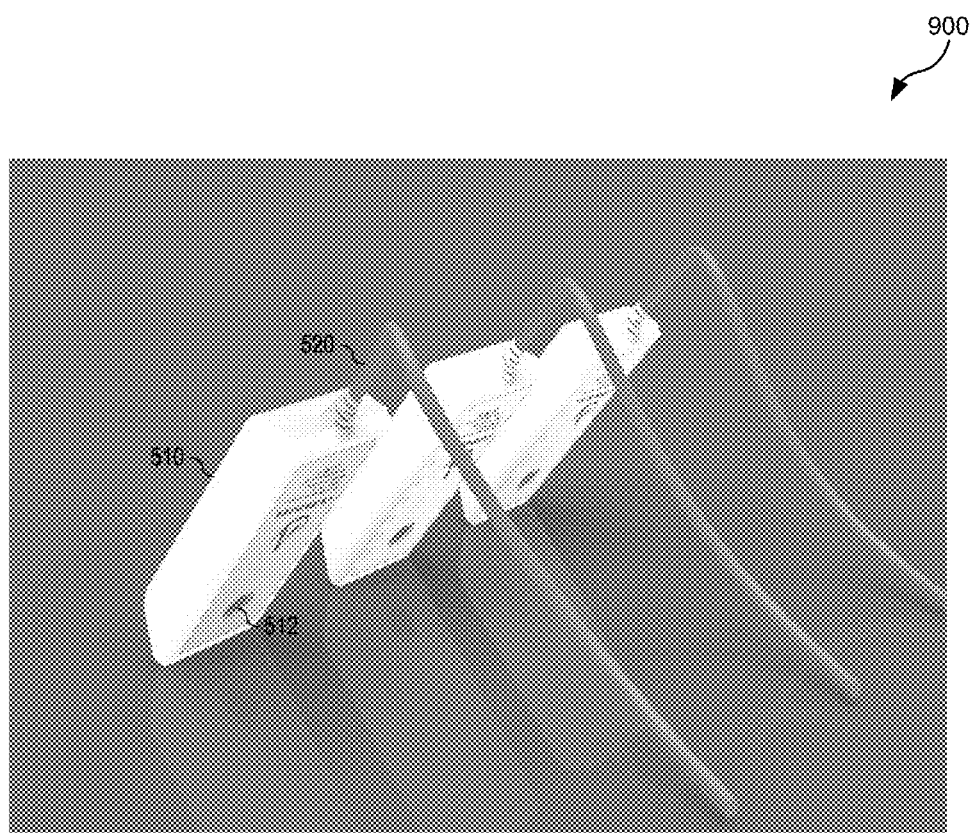
FIGS. 9 and 10 show a plurality of Calispector™ devices in accordance with a preferred embodiment.
Figure 10:
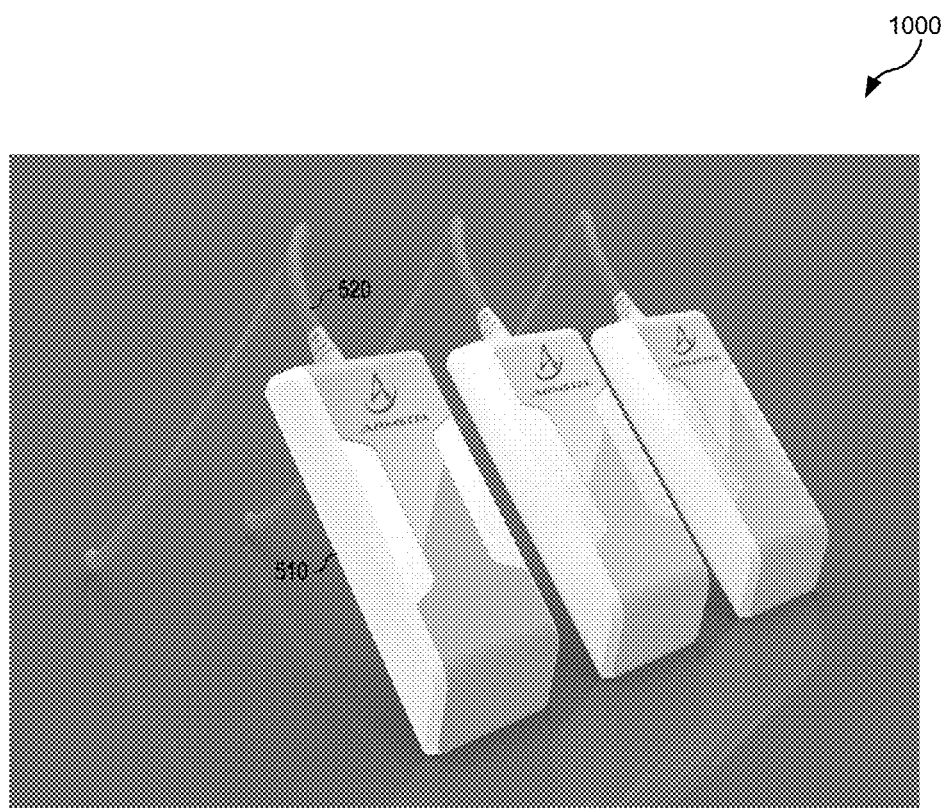

Next, FIGS. 9 and 10 show front and back side views of "Simlux™" meter models configured according to one embodiment. Specifically, view 900 shows a plurality of meters from a rear, underside perspective. View 1000 shows a plurality of meters from a front, top perspective.

As shown, each meter includes a test array 512 coupled to a casing 510. In the illustrated embodiment of FIG. 5, above, test array 512 is shown as partially extruding outward from the boundaries of the enclosure formed by casing 510. In the illustrated embodiment of FIG. 9, test array 512 rests entirely within a slight recess in the enclosure formed by casing 510. Additionally, in the illustrated embodiments of FIGS. 9 and 10, a link 520 couples to casing 510. In the illustrated embodiment, link 520 is a USB capable link that couples to a standard USB connector, operable to couple to a standard USB port (not shown).

One skilled in the art will understand that the stylistic elements shown in FIGS. 7-10 can be modified without departing from the scope of the disclosed embodiments. Additionally, one skilled in the art will understand that the functional elements shown in FIGS. 7-10 can also be configured in various ways, without departing from the scope of the disclosed embodiments.

Accordingly, the disclosed embodiments provide numerous advantages over other methods and systems. For example, one skilled in the art will appreciate that various display vendors may claim that their products are DICOM standard compliant. However, typical supporting evidence to confirm DICOM standard compliance comes from the vendors themselves, or operates on an uncommon operating system platform. The disclosed embodiments provide an objective, unbiased tool to measure different vendor's display products. Further, the disclosed embodiments provide a tool that can be operated in conjunction with a common operating system platform.

Additionally, common display test methods tend to be restricted to systems and methods that operate from the platform from which the display device under test usually operates. In the disclosed embodiments, system for testing a display can operate from portable workstation not ordinarily coupled to the display device under test. Accordingly, one skilled in the art will appreciate that the disclosed embodiments can be configured to inspect individual displays in remote locations without requiring extensive modifications to the workstations to which the displays under test ordinarily couple.

Finally, one skilled in the art will understand that Digital Imaging and Communications in Medicine (DICOM) is a standard for handling, storing, printing, and transmitting information in medical imaging. In one embodiment, the predetermined standard is the DICOM Part 14 Grayscale Standard Display Function standard. The National Electrical Manufacturers Association (NEMA) created the DICOM standard in part to insure that diagnostic images appear the same, whether viewed via print, film, or electronic display.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

One skilled in the art will appreciate that variations of the above-disclosed and other features and functions, or alternatives thereof, may be desirably combined into many other different systems or applications. Additionally, various presently unforeseen or unanticipated alternatives, modifications, variations or improvements therein may be subsequently made by those skilled in the art, which are also intended to be encompassed by the following claims.

What is claimed is:

1. A method for determining whether an electronic display conforms to a standard, comprising:
    causing a portion of an electronic display to produce a first test output including a grayscale test pattern designed for determining whether the electronic display conforms to the standard, the causing being performed by a vendor-neutral software product installed on a computer, the computer being coupled to the electronic display;
    capturing a light characteristic of the first test output, emitted directly by the electronic display, with a vendor-neutral portable device, the vendor-neutral portable device being coupled to the computer and coupled to the electronic display producing the first test output;
    determining whether the captured light characteristic conforms to the standard; and
    calibrating the electronic display in response to the captured light characteristic of the first test output.

2. The method of claim 1, wherein the standard is the DICOM standard.

3. The method of claim 1, wherein the electronic display is any vendor-neutral LCD display.

4. The method of claim 1,
    wherein the electronic display is an ARMSTEL LCD.

5. The method of claim 1, further comprising:
    causing at least a portion of the electronic display to produce a second test output;
    capturing a light characteristic of the second test output with the portable device; and
    determining whether the captured light characteristic of the second test output conforms to the standard.

6. The method of claim 1, further comprising generating a report based on the determining whether the captured light characteristic conforms to a standard.

7. The method of claim 1, wherein determining whether the captured light characteristic conforms to a standard comprises comparing the captured light characteristic to a corresponding characteristic of a Barton curve.

8. The method of claim 1, wherein the vendor-neutral portable device is a lux meter, the lux meter comprising:
    a plurality of photodiodes;
    a custom processor coupled to the plurality of diodes; and
    a USB link coupled to the custom processor and the computer.

9. The method of claim 1, wherein causing at least a portion of the electronic display to produce a first test output is performed by a computer program operating in conjunction with a common operating system.

10. The method of claim 1 wherein the first test output includes a 2048-shade grayscale test pattern.

11. A system for determining whether an electronic display conforms to a standard, comprising:
    a vendor-neutral software product installed on a computer, the computer being coupled to an electronic display, the vendor-neutral software product able to cause a portion of the electronic display to produce a first test output including a grayscale test pattern designed for determining whether the electronic display conforms to the standard;
    a vendor-neutral portable device coupled to the computer and coupled to the electronic display producing the first test output, the vendor-neutral device able to capture a light characteristic of the first test output emitted directly by the electronic display; and a first module coupled to the computer, the module able to determine whether the captured light characteristic conforms to the standard, wherein the vendor-neutral software product is further able to calibrate the electronic display in response to the captured light characteristic of the first test output.

12. The system of claim 11, wherein the standard is the DICOM standard.

13. The system of claim 11, wherein the electronic display is any vendor-neutral LCD display.

14. The system of claim 11, wherein the electronic display is an ARMSTEL LCD.

15. The system of claim 11, wherein the vendor-neutral software product is further able to:

cause at least a portion of the electronic display to produce a second test output;

receive a captured light characteristic of the second test output; and determine whether the captured light characteristic of the second test output conforms to the standard; and wherein the electronic display is an ARMSTEL LCD.

16. The system of claim 11, wherein the light characteristic is luminance.

17. The system of claim 11, wherein determining whether the captured light characteristic conforms to a standard comprises comparing the captured light characteristic to a corresponding characteristic of a Barton curve.

18. The system of claim 11, wherein the vendor-neutral portable device is a lux meter, the lux meter comprising:

a plurality of photodiodes;

a custom processor coupled to the plurality of diodes; and a USB link coupled to the custom processor and the computer.

19. The system of claim 11, wherein causing at least a portion of the electronic display to produce a first test output is performed by a computer program operating in conjunction with a common operating system.

20. A meter, comprising:

a plurality of photodiodes;

a custom processor coupled to the plurality of diodes; and a USB link coupled to the custom processor, the USB link able to couple to a computer; wherein the computer includes a vendor-neutral software product installed on the computer, the computer being coupled to an electronic display, the vendor-neutral software product able to cause a portion of the electronic display to produce a first test output including a grayscale test pattern designed for determining whether the electronic display conforms to a standard, wherein the plurality of photodiodes is able to capture a light characteristic of the first test output emitted directly by the electronic display while the meter is coupled to the electronic display;

wherein the custom processor is able to determine whether the captured light characteristic conforms to the standard; and wherein the custom processor is able to calibrate the electronic display in response to the captured light characteristic of the first test output.

\* \* \* \* \*